United States Patent
Deguenther

(10) Patent No.: US 9,810,890 B2
(45) Date of Patent: Nov. 7, 2017

(54) COLLECTOR

(71) Applicant: Carl Zeiss SMT GmbH, Oberkochen (DE)

(72) Inventor: Markus Deguenther, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 6 days.

(21) Appl. No.: 15/061,597

(22) Filed: Mar. 4, 2016

(65) Prior Publication Data

US 2016/0187632 A1   Jun. 30, 2016

Related U.S. Application Data

(63) Continuation of application No. PCT/EP2014/067963, filed on Aug. 25, 2014.

(30) Foreign Application Priority Data

Sep. 11, 2013  (DE) .................. 10 2013 218 132

(51) Int. Cl.
*G02B 27/54* (2006.01)
*G02B 19/00* (2006.01)
(Continued)

(52) U.S. Cl.
CPC ........... *G02B 19/0023* (2013.01); *G02B 5/09* (2013.01); *G02B 19/0095* (2013.01);
(Continued)

(58) Field of Classification Search
CPC .. G03F 7/702; G03F 7/70075; G03F 7/70108; G03F 7/70358; G02B 19/0023
(Continued)

(56) References Cited

U.S. PATENT DOCUMENTS 5,339,346 A   8/1994 White
6,210,865 B1   4/2001 Sweatt et al.
(Continued)

FOREIGN PATENT DOCUMENTS

DE           101 38 313 A1    7/2002
DE    10 2006 014 380 A1   10/2007
(Continued)

OTHER PUBLICATIONS

International Search Report for corresponding PCT Appl No. PCT/EP2014/067963, dated Nov. 12, 2014.
(Continued)

*Primary Examiner* — Hung Henry Nguyen
(74) *Attorney, Agent, or Firm* — Fish & Richardson P.C.

(57) ABSTRACT

A collector transfers EUV illumination light from a radiation source region to illumination optics. Imaging optics of the collector image the radiation source region in a downstream focal region. The imaging optics are embodied so that the radiation source is imaged with at least one first imaging scale by the EUV illumination light, which is emitted with beam angles <20° between the radiation source region and the downstream focal region. The imaging optics are also embodied so that the radiation source is imaged with at least one second imaging scale by the illumination light emitted with beam angles >70°. The two imaging scales for the beam angles <20° on the one hand and >70° on the other hand differ by no more than a factor of 2.5. In addition to a corresponding collector, an illumination system contains field facets transfer optics.

16 Claims, 10 Drawing Sheets

(51) Int. Cl.
*G03F 7/20* (2006.01)
*G02B 5/09* (2006.01)
*G21K 1/06* (2006.01)

(52) U.S. Cl.
CPC .......... *G03F 7/702* (2013.01); *G03F 7/70075* (2013.01); *G03F 7/70175* (2013.01); *G21K 1/06* (2013.01); *G21K 2201/064* (2013.01)

(58) Field of Classification Search
USPC ........................................ 355/52, 53, 67–71
See application file for complete search history.

(56) References Cited

U.S. PATENT DOCUMENTS

| | | |
|---|---|---|
| 6,285,737 B1 | 9/2001 | Sweatt et al. |
| 6,438,199 B1 | 8/2002 | Schultz et al. |
| 6,507,440 B1 | 1/2003 | Schultz |
| 7,075,712 B2 | 7/2006 | Kinoshita et al. |
| 7,075,713 B2 | 7/2006 | Arenberg |
| 7,329,886 B2 * | 2/2008 | Singer .................... B82Y 10/00 250/493.1 |
| 7,501,641 B2 | 3/2009 | Silverman et al. |
| 2003/0043455 A1 | 3/2003 | Singer et al. |
| 2003/0086524 A1 | 5/2003 | Schultz et al. |
| 2004/0037387 A1 | 2/2004 | Antoni et al. |
| 2004/0256575 A1 | 12/2004 | Singer et al. |
| 2005/0199829 A1 | 9/2005 | Partlo et al. |
| 2006/0120429 A1 | 6/2006 | Murakami |
| 2006/0176547 A1 | 8/2006 | Sasian |
| 2007/0223112 A1 | 9/2007 | Mann et al. |
| 2008/0225387 A1 | 9/2008 | Hainz et al. |
| 2008/0266650 A1 | 10/2008 | Sasian |
| 2012/0162627 A1 | 6/2012 | Fiolka et al. |
| 2013/0022901 A1 | 1/2013 | Buurman et al. |
| 2014/0192339 A1 * | 7/2014 | Saenger .............. G03F 7/70166 355/67 |
| 2016/0187785 A1 | 6/2016 | Deguenther |

FOREIGN PATENT DOCUMENTS

| | | |
|---|---|---|
| DE | 10 2009 045 135 A1 | 3/2011 |
| DE | 10 2010 063 530 A1 | 6/2011 |
| DE | 10 2011 084 266 A | 4/2013 |
| EP | 1 469 349 A1 | 10/2004 |
| EP | 1 650 786 B1 | 4/2006 |
| WO | WO 2007/045434 | 4/2007 |
| WO | WO 2011/138259 A1 | 11/2011 |
| WO | WO 2012/013241 A1 | 2/2012 |
| WO | WO 2013/053692 A | 4/2013 |

OTHER PUBLICATIONS

German Office Action, with translation thereof, for corresponding DE Appl No. 10 2013 218 132.9, dated Jun. 5, 2014.

\* cited by examiner

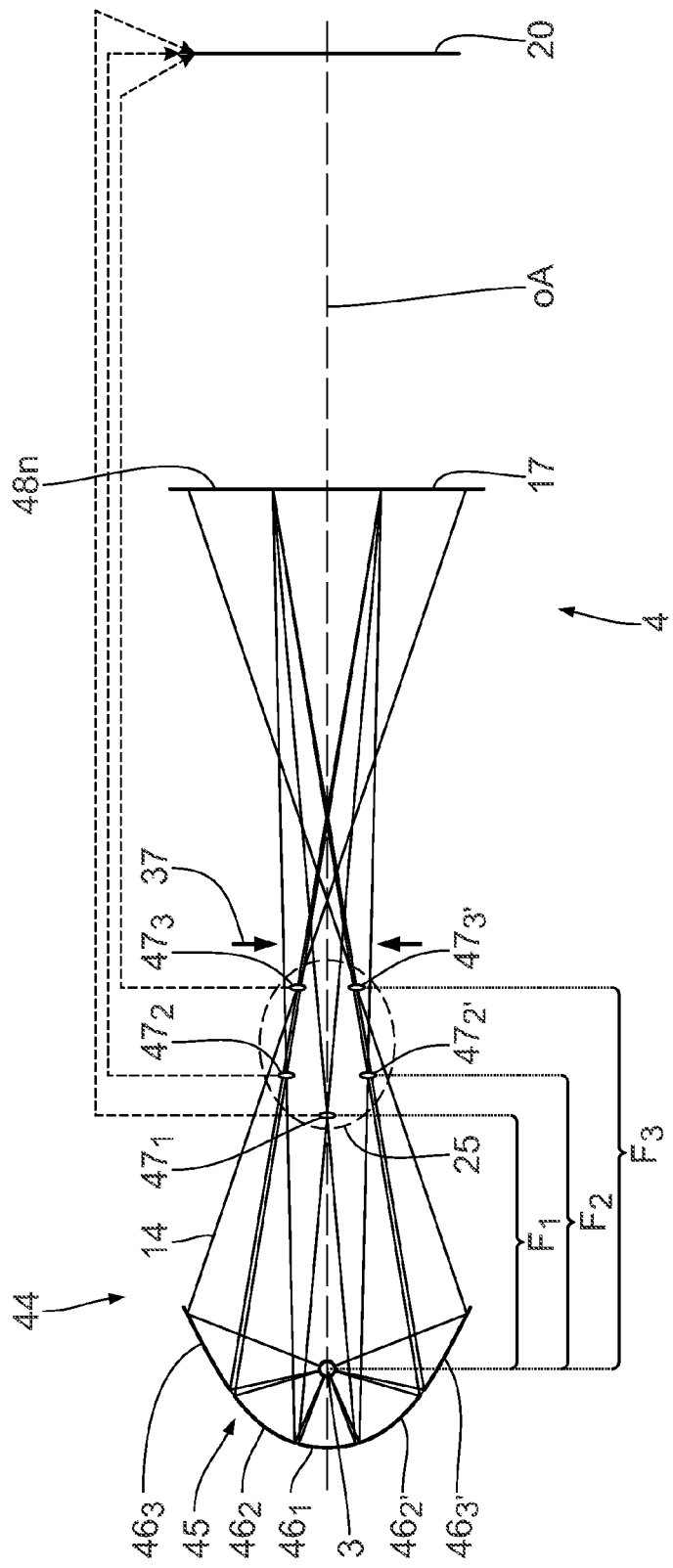

COLLECTOR

CROSS-REFERENCE TO RELATED APPLICATIONS

The present application is a continuation of, and claims benefit under 35 USC 120 to, international application PCT/EP2014/067963, filed Aug. 25, 2014, which claims benefit under 35 USC 119 of German Application No. 10 2013 218 132.9, filed Sep. 11, 2013. The entire disclosure of international application PCT/EP2014/067963 is incorporated by reference herein.

FIELD

The disclosure relates to an illumination system with illumination optics, which guide EUV illumination light collected by a collector to an object field. Furthermore, the disclosure relates to a collector for transferring EUV illumination light from a radiation source region toward illumination optics, a projection exposure apparatus with such an illumination system, a method for producing a microstructured or nanostructured component with such a projection exposure apparatus, and a component produced by the method.

BACKGROUND

Collectors are known from U.S. Pat. No. 6,507,440 B1, DE 10 2010 063 530 A1, WO 2011/138259 A1, from U.S. Pat. No. 7,075,712 B2, U.S. Pat. No. 7,501,641 B2, US 2006/0176547 A1, US 2006/0120429 A1, U.S. Pat. No. 7,075,713 B2, EP 1 469 349 A1, US 2008/0266650 A1, WO 2007/045 434 A2, U.S. Pat. No. 6,438,199 B1, U.S. Pat. No. 5,339,346 A, EP 1 650 786 B1, DE 10 2011 084 266 A and WO 2013/053 692 A.

SUMMARY

The disclosure seeks to develop a collector, in particular as part of an illumination system, such that an efficient transfer of the EUV illumination light into an illumination field or object field is ensured.

In one aspect, the disclosure provides an illumination system with illumination optics which guide EUV illumination light collected by a collector to an object field. The collector serves to transfer the EUV illumination light from a radiation source region to the illumination optics. The illumination optics have: a field facet mirror with a multiplicity of field facets; and a pupil facet mirror with a multiplicity of pupil facets, which are part of pupil facet transfer optics, which image the field facets in a manner superposed on one another into the object field. The collector has collector imaging optics, which image the radiation source region into a plurality of downstream focal regions. The field facets are part of field facet transfer optics, which in each case image one of the focal regions onto one of the pupil facets. The collector imaging optics are embodied in such a way that: the radiation source is imaged into the first focal region disposed downstream thereof with a first collector imaging scale via the EUV illumination light, which is emitted by the radiation source region with beam angles <20° with respect to an optical axis between the radiation source region and a first focal region disposed downstream thereof; and the radiation source is imaged into second focal regions disposed downstream thereof, which are spatially separate from the first focal region, with a second collector imaging scale via the EUV illumination light, which is emitted by the radiation source region with beam angles >70° with respect to an optical axis between the radiation source region and the first focal region disposed downstream thereof. The field facet transfer optics are embodied in such a way that: the first focal region is imaged with a first facet imaging scale; and the second focal region is imaged with a second facet imaging scale. The product of the first collector imaging scale and the first facet imaging scale differs from the product of the second collector imaging scale and the second facet imaging scale differs by no more than a factor of 2.5 for all light paths of the illumination light to the pupil facets.

In one aspect, the disclosure provides a collector for transferring EUV illumination light from a radiation source region toward illumination optics, which guide the EUV illumination light toward an object field. The collector is embodied for reflecting guidance of the EUV illumination light with angles of incidence less than 45°. The collector has collector imaging optics, which image the radiation source region into a focal region disposed downstream thereof. The collector imaging optics are embodied in such a way that: the radiation source is imaged into the focal region disposed downstream thereof with at least one first imaging scale via the EUV illumination light, which is emitted by the radiation source region with beam angles <20° with respect to an optical axis between the radiation source region and a focal region disposed downstream thereof; and the radiation source is imaged into the focal region disposed downstream thereof with at least one second imaging scale via the EUV illumination light, which is emitted by the radiation source region with beam angles >70° with respect to an optical axis between the radiation source region and a focal region disposed downstream thereof. The imaging scales differ by no more than a factor of 2.5.

As a result of the adaptation, according to the disclosure, of the imaging scales of the collector imaging optics to the beam angles of the EUV illumination light emitted by the radiation source, there is an advantageously low variation in a cross section of the downstream focal region. This enables a pupil illumination of an illumination system, disposed downstream of the collector, with an advantageously high pupil fill. In the illumination system, a scale variation when imaging the radiation source region via an interposed downstream focal region onto the pupil facets is split between the collector imaging optics and the field facet transfer optics in such a way that a scale variation of the overall image is advantageously kept small. The product between the collector imaging scales and the associated facet imaging scales can differ by no more than a factor of 2.25, by no more than a factor of 2.0, by no more than a factor of 1.9, by no more than a factor of 1.8, by no more than a factor of 1.7, by no more than a factor of 1.6, or else by no more than a factor of 1.5 or even by no more than a factor of 1.25 for all light paths of the illumination light toward the pupil facets. This results in advantages which are also explained in conjunction with the collector.

The imaging scales discussed above in the context of the solution to the problem are the imaging scales respectively averaged for one region of beam angles. The imaging scale is an area imaging scale.

The collector can be embodied for guiding the EUV illumination light with angles of incidence less than 45°, i.e. it can be embodied as a collector for substantially normal incidence (NI) of the illumination light. Angles of incidence of the illumination light on the collector can be less than 40°, less than 35°, less than 30°, less than 25°, less than 22.5° or less than 20°. In particular, all angles of incidence on the collector can be smaller than the above-described upper limits.

The imaging scales for beam angles less than 20° on the one hand and beam angles greater than 70° on the other hand can differ in the collector according to the disclosure by no more than a factor of 2.25, by no more than a factor of 2.0, by no more than a factor of 1.9, by no more than a factor of 1.8, by no more than a factor of 1.7, by no more than a factor of 1.6, by no more than a factor of 1.5 and even by no more than a factor of 1.25.

In some embodiments, the collector imaging optics has a plurality of collector imaging mirrors arranged separately from one another, wherein: each collector imaging mirror is embodied in such a way that it acquires EUV illumination light from the radiation source region, which is emitted in an angular range of beam angles in relation to an optical axis between the radiation source region and the downstream focal region; the range of imaging scales of each collector imaging mirror lies between a minimum imaging scale and maximum imaging scale; and a ratio between the maximum imaging scale and the minimum imaging scale ≤2. In such a collector, a variation of an imaging scale is minimized in a targeted manner by the collector imaging mirrors and this ensures a harmonization of the cross-sectional extent of the downstream focal region. The ratio between the maximum and the minimum imaging scale of each collector imaging mirror can be at most 1.9, can be at most 1.8, can be at most 1.7 and can lie in the region of, for example, 1.67.

At least some of the collector imaging mirrors can be configured as ring mirrors. Such ring mirrors are well adapted to the symmetry when recording a rotationally symmetrically emitting radiation source region. The ring mirrors can be arranged lying coaxially within one another.

The mirror surfaces of at least some of the collector imaging mirrors can be ellipsoidal. Ellipsoidal mirror surfaces can be manufactured with comparatively little outlay.

Spherical optics can be used, which image the radiation source region in a radiation source image region and which lie in the region of the radiation source region. Such spherical optics increase the solid angle region around the radiation source acquirable by the collector.

An illumination system can include a collector described herein and illumination optics. The illumination optics can include a field facet mirror and a pupil facet mirror, wherein: first imaging of the radiation source region of the collector imaging optics in the beam path of the illumination light after the radiation source region occurs in the downstream focal region; and the downstream focal region lies in the region of the pupil facet mirror. The advantages of such an illumination system correspond to those which were already explained above with reference to the collector according to the disclosure. Intermediate imaging of the radiation source in the beam path, in particular upstream of the field facet mirror, is dispensed with, which simplifies the optical design of the illumination system.

A constriction region can lie between the collector and a first component of the illumination optics, in which constriction region a cross section of the overall beam of the EUV illumination light is reduced by at least a factor of two compared to the cross section on the field facet mirror. Such a constriction region enables the separation of a radiation source module from an illumination module of the illumination system disposed downstream thereof. Carried-along foreign particles, which are emitted by the components of the radiation source, can be suppressed more easily in this manner. The constriction region no longer coincides with the downstream focal region, which is arranged downstream of the constriction region in the illumination system.

The collector imaging optics can have a plurality of collector mirrors arranged separately from one another. Separate collector mirrors simplify the production of collector imaging optics with a constricting effect and with a non-imaging effect at the location of the constriction. The collector mirrors can have mirror surfaces which are designed as free-form surfaces. Here, free-form surfaces are surfaces which cannot be described mathematically by a rotationally symmetric function. Examples of this are provided in WO 2012/013 241 A1 and the references cited therein. The collector mirrors can be embodied and arranged in such a way that a maximum angle of incidence of the illumination light on the collector mirrors is less than 45°.

At least some of the mirror surfaces of the collector mirrors can have an edge contour which is similar to an edge contour of field facets of the field facet mirror. Such an edge contour design leads to an efficient guidance of the illumination light in the illumination system.

The collector mirrors can have a rectangular edge contour. As an alternative to a rectangular or square edge contour of the collector mirrors, an edge contour of the collector mirrors can also have a hexagonal embodiment.

A projection exposure apparatus can include an illumination system described herein and an EUV radiation source. The advantages of a projection exposure apparatus that includes an illumination system described herein and an EUV radiation source, a production method of using such a projection exposure apparatus and a microstructured or nanostructured component made according to such a method correspond to those which were already explained above with reference to the collector according to the disclosure or with reference to the illumination system according to the disclosure.

BRIEF DESCRIPTION OF THE DRAWINGS

Exemplary embodiments of the disclosure are explained in more detail below on the basis of the drawings, in which:

FIG. 8 shows a further embodiment of an illumination system with a collector, a field facet mirror and a pupil facet mirror, wherein a reflecting effect of the field facet mirror has been omitted for an improved visualization;

DETAILED DESCRIPTION

Figure 1:
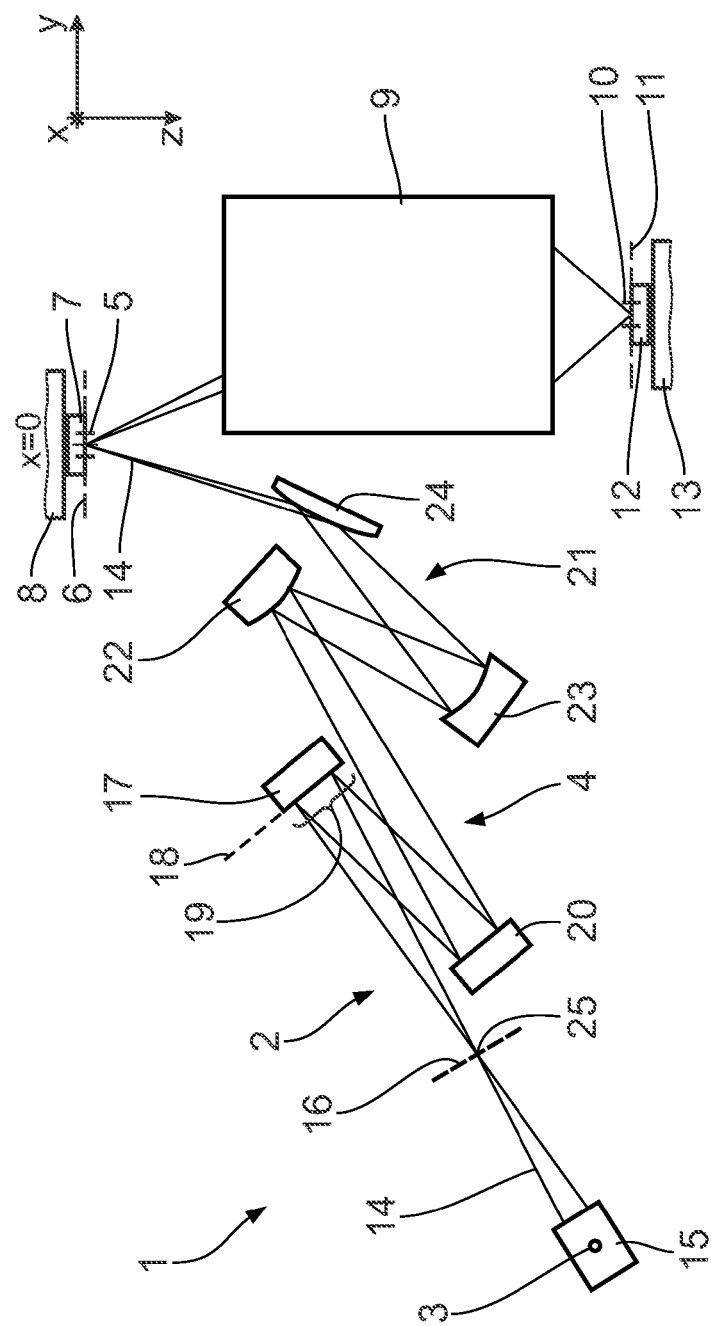
FIG. 1 schematically shows a meridional section through a projection exposure apparatus for EUV projection lithography, with an EUV illumination system with EUV illumination optics and an EUV collector.

FIG. 1 schematically shows an EUV projection exposure apparatus 1 for microlithography in a meridional section. An illumination system 2 of the projection exposure apparatus 1 has, besides a radiation source or light source 3, illumination optics 4 for the exposure of an object field or illumination field 5 in an object plane 6. Here, a reticle 7 arranged in the object field 5, which is held by a reticle holder 8 (only depicted in sections here), is exposed. A projection optical unit 9 serves for imaging the object field 5 into an image field 10 in an image plane 11. A structure on the reticle 7 is imaged on a light-sensitive layer of a wafer 12 held by a wafer holder 13 that is likewise depicted schematically here, the wafer being arranged in the region of the image field 10 in the image plane 11. Together, the illumination optics 4 and the projection optics 9 form an optical system in the projection exposure apparatus 1.

The radiation source 3 is an EUV radiation source having an emitted used radiation in the range of between 5 nm and 30 nm. Here, it can be a plasma source, in particular an LPP (laser-produced plasma) source. The EUV radiation source can also be, for example, a DPP (gas discharge produced plasma) source. EUV radiation 14, emanating from the radiation source 3, is received and focused by a collector 15, which is depicted very schematically as a block in FIG. 1. The collector 15 will be described in yet more detail below. The EUV radiation 14 is also referred to hereinafter as used emission, as illumination light or as imaging light. Downstream of the collector 15, the EUV radiation 14 propagates through an intermediate focal plane 16 in the embodiment according to FIG. 1, before being incident on a field facet mirror 17. Such an intermediate focal plane 16 is not mandatory. Instead of a single intermediate focus, as is depicted schematically in FIG. 1, it is also possible for a plurality of intermediate foci or else astigmatic foci in various planes or even no intermediate focus to be present, as will still be explained below. The field facet mirror 17 is arranged in a plane 18 of the illumination optics 4 that is optically conjugate to the object plane 6. There is an illumination far field 19 of the EUV radiation 14, which is formed by transferring the used emission 14 from the collector 15, in this plane 18. A gap-free illumination of the whole field facet mirror 17 can be achieved.

Downstream of the field facet mirror 17, the EUV radiation 14 is reflected by a pupil facet mirror 20. The pupil facet mirror 20 is arranged in a pupil plane of the illumination optics 4, which is optically conjugate with respect to a pupil plane of the projection optics 9. With the aid of an optical assembly, imaging the pupil facet mirror 20, in the form of further transfer optics 21 with mirrors 22, 23 and 24 designated in the order of the beam path, field facets of the field facet mirror 17 are imaged into the object field 5 in a manner superimposed on one another. The last mirror 24 of the transfer optics 21 is a grazing incidence mirror, i.e. a mirror with an angle of incidence of the EUV radiation which is significantly greater than 45° and can be greater than 60°. The pupil facet mirror 20 and the transfer optics 21 form sequential optics for transferring the illumination light 14 into the object field 5. It is possible to dispense with the transfer optics 21, in particular if the pupil facet mirror 20 is arranged in an entry pupil of the projection optics 9. The pupil facet mirror 20 then constitutes the only transfer optics for superposed imaging of the field facets of the field facet mirror 17 into the illumination field 5.

In order to simplify the description of positional relationships, FIG. 1 plots a Cartesian xyz-coordinate system as a global coordinate system for the description of the positional relationships of components of the projection exposure apparatus 1 between the object plane 6 and the image plane 11. The x-axis extends perpendicular to the plane of the drawing in FIG. 1 and into the latter. The y-axis runs towards the right in FIG. 1. In FIG. 1, the z-axis extends downward, i.e. perpendicular to the object plane 6 and to the image plane 11. Furthermore, a local xyz-coordinate system is specified, at times, along the beam path of the used emission 14. The z-axis of these local coordinate systems in each case specifies the beam direction of the used emission 14. The x-axis of the local coordinate systems regularly extends parallel to the x-axis of the global coordinate system. Depending on the orientation of the local coordinate system, the y-axis of the local coordinate system is tilted in relation to the y-axis of the global coordinate system.

The reticle holder 8 and the wafer holder 13 are both displaceable in a controlled manner in such a way that, during the projection exposure, the reticle 7 and the wafer 12 are scanned in a displacement direction, namely in the y-direction of the global xyz-coordinate system, through the object field 5 and the image field 10, respectively. Below, the displacement direction y is also referred to as scanning direction.

The EUV collector 15 serves to transfer the used emission 14 from the EUV radiation source 3 to the EUV far field 19. In the EUV far field 19, the field facet mirror 17 is arranged as a further EUV mirror component, which transfers the used emission 14 into the illumination field 5.

Figure 2:
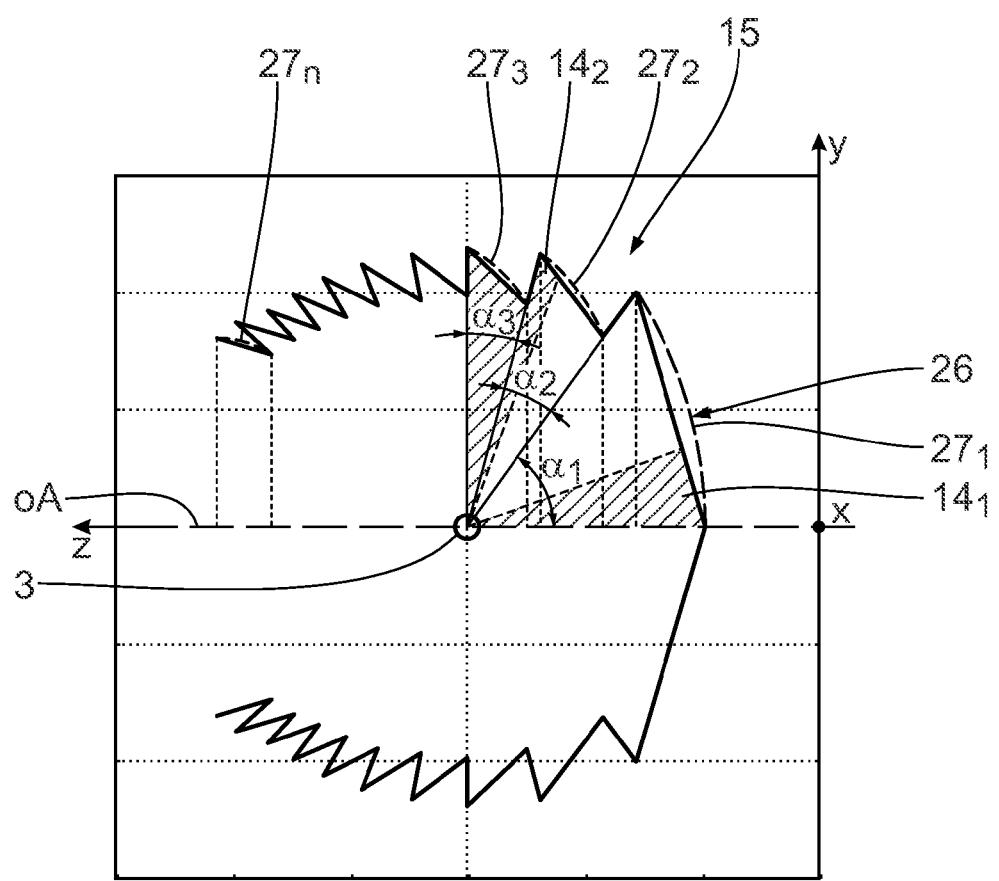
FIG. 2 shows a meridional section of an embodiment of the EUV collector with a plurality of collector imaging mirrors arranged separately from one another, of which some are embodied as ring mirrors.

FIG. 2 shows an embodiment of the collector 15 in a meridional section. Components and functions, which have already been explained above with reference to FIG. 1 bear the same reference signs and will not be discussed in detail again. A local Cartesian xyz-coordinate system is plotted in FIG. 2. The x-axis of the coordinate system according to FIG. 2 extends parallel to the x-axis of the global coordinate system according to FIG. 1 and extends perpendicular to the plane of the drawing in FIG. 2 and out of the latter. The y-axis extends upward in FIG. 2. In FIG. 2, the z-axis extends to the left and extends parallel to a chief ray direction of a beam path of the illumination light 14 after the collector 15. The z-axis extends along a connecting line between the light source 3, for example an emitting plasma volume, which is also referred to as radiation source region, and an intermediate focus 25 (cf. FIG. 1). At the same time, this connecting line between the radiation source region 3 and the focal region 25 disposed downstream thereof constitutes an optical axis oA of the collector 15. The intermediate focus 25 constitutes a downstream focal region. In this downstream focal region 25, the collector 15 images the radiation source region 3 with the aid of collector imaging optics 26.

The collector 15 is embodied in a manner rotationally symmetric about the z-axis.

The collector imaging optics 26 have a plurality of collector imaging mirrors $27_n$ arranged separately from one another, of which the three innermost collector imaging mirrors $27_1$, $27_2$ and $27_3$ are depicted in the half-space of positive y values, using dashed lines, in the meridional section in FIG. 2. Apart from the innermost collector imaging mirror $27_1$, all other collector imaging mirrors $27_n$ are embodied as ring mirrors. The ring mirrors $27_n$ are arranged lying coaxially within one another. The innermost collector imaging mirror $27_1$ closest to the z-axis is embodied as an ellipsoidal shell. Where it is intersected by the z-axis, the latter can have a passage opening for a laser beam for igniting the plasma in the radiation source region 3; this is not depicted in FIG. 2. The further collector imaging mirrors $27_2$ to $27_n$ each have ellipsoidal mirror surfaces in turn, which, in the half-space of positive y values in FIG. 2, are indicated by dashed lines for the collector imaging mirrors $27_2$, $27_3$ and $27_n$.

In FIG. 2, the subdivision into collector imaging mirrors $27_n$ is indicated by a jagged, full line, the line portions of which extend in a straight line in each case and which does not coincide with the dashed mirror surfaces.

The collector imaging mirror $27_1$ receives EUV illumination light 14, which is emitted by the radiation source region 3 with beam angles $\alpha_1$ that are less than 55°. The collector imaging mirror $27_2$, i.e. the second ellipsoidal shell of the collector 15 and, at the same time, the first ring mirror, receive the illumination light 14 emitted by the radiation source region 3 in a beam angle range $\alpha_2$ of between 55° and approximately 73°. The next collector imaging mirror $27_3$ receives the illumination light 14 emitted by the radiation source region 3 in a beam angle range $\alpha_3$ of between approximately 73° and 90°. The following collector imaging mirrors $27_4$ to $27_n$ receive the illumination light 14 emitted by the radiation source region 3 with respectively assigned beam angle ranges $\alpha_n$, which cover the beam angle range between 90° and approximately 145°. The collector imaging mirrors $27_1$ to $27_n$ are therefore embodied in such a way that they each acquire components of the EUV illumination light 14 from the radiation source region 3, which are emitted in an angular range of beam angles $\alpha_n$ with respect to the optical axis oA between the radiation source region 3 and the focal region 25 disposed downstream thereof.

In particular, the innermost collector imaging mirror $27_1$ images EUV illumination light 14, which is emitted by the radiation source region 3 with beam angles <20° with respect to the optical axis between the radiation source region 3 and the focal region 25 disposed downstream thereof.

This imaging by the innermost collector imaging mirror $27_1$ is realized with a first imaging scale $\beta_1$.

The imaging scale $\beta$ is an area imaging scale. The imaging scale $\beta$ therefore specifies the ratio by which an area to be imaged is reduced or magnified.

The collector imaging mirror $27_2$ images the illumination light 14 incident thereon in the beam angle range $\alpha_2$ with a second imaging scale $\beta_2$. The illumination light which is imaged by the second collector imaging mirror $27_2$ includes illumination light 14 which is emitted by the radiation source region 3 with beam angles >70°, namely in the beam angle range of between 70° and 73°, with respect to the optical axis oA.

These components of the illumination light 14, firstly emitted with beam angles <20° and secondly emitted with beam angles >70°, which are imaged by the collector imaging mirrors $27_1$ and $27_2$, respectively, are indicated by hatching in FIG. 2 at $14_1$ and $14_2$.

The two imaging scales $\beta_{1,20}$ and $\beta_{2,70}$, firstly for the EUV illumination light which, with beam angles <20°, is imaged by the innermost collector imaging mirror $27_1$ into the downstream focal region 25 and, secondly, for the illumination light 14 which, with the beam angles >70°, is imaged by the second collector imaging mirror $27_2$, i.e. the imaging scales $\beta_1$ and $\beta_2$ for these selected beam angle ranges, differ by no more than a factor of 2.5.

Depending on the embodiment of the collector 15, a difference between the imaging scales $\beta_{1,20}$ and $\beta_{2,70}$ can also be no greater than 2.25, can be no greater than 2.0, can be no greater than 1.9, can be no greater than 1.8, can be no greater than 1.7, can be no greater than 1.6 and can also be no greater than 1.5. Depending on these maximum differences between the imaging scales $\beta_{1,20}$ and $\beta_{2,70}$, a correspondingly small difference in the size of the intermediate focal region 25 emerges, which results from, firstly, imaging the radiation source region 3 by way of the collector imaging mirror $27_1$ and, secondly, from imaging by way of the collector imaging mirror $27_2$. As a result of the imaging scale variation, reduced by way of the imaging scales adapted to the beam angles $\alpha$, for the different beam angles, there therefore is a correspondingly reduced variation in the sizes of the various radiation source images in the intermediate focal region 25 (cf. FIG. 1) for the illumination light components which are emitted with different beam angles $\alpha_1$ from the radiation source region 3. Overall, this results in an intermediate focal region 25 with a smaller size variation.

Accordingly, the imaging scale $\beta_3$ for the third collector imaging mirror $27_3$ is also adapted to the beam angle $\alpha_3$ of the illumination light 14 such that, compared to the imaging scales $\beta_{1,20}$ and $\beta_{2,70}$, this once again only results in a small imaging scale difference.

The imaging scale $\beta_n$ of each collector imaging mirror $27_n$ varies between a minimum imaging scale $\beta_{n,min}$ and a maximum imaging scale $\beta_{n,max}$, depending on the respective beam angle $\alpha_n$ of the illumination light 14 on the collector imaging mirror $27_n$. The following applies to the ratio $\beta_{n,max}/\beta_{n,min}$ between these imaging scales on one and the same collector imaging mirror $27_n$: $\beta_{n,max}/\beta_{n,min} \leq 2$. Depending on the embodiment, this ratio can also be $\leq 1.9$, it can be $\leq 1.8$, it can be $\leq 1.7$ and it can equal 1.67, for example.

In the embodiment according to FIG. 2, a normalized scale variation $\beta_n/\beta_0$ for each collector imaging mirror $27_n$ lies in the interval [0.75, 1.25]. Here, $\beta_0$ is a standard imaging scale, predetermined for the collector 15 overall.

Figure 3:
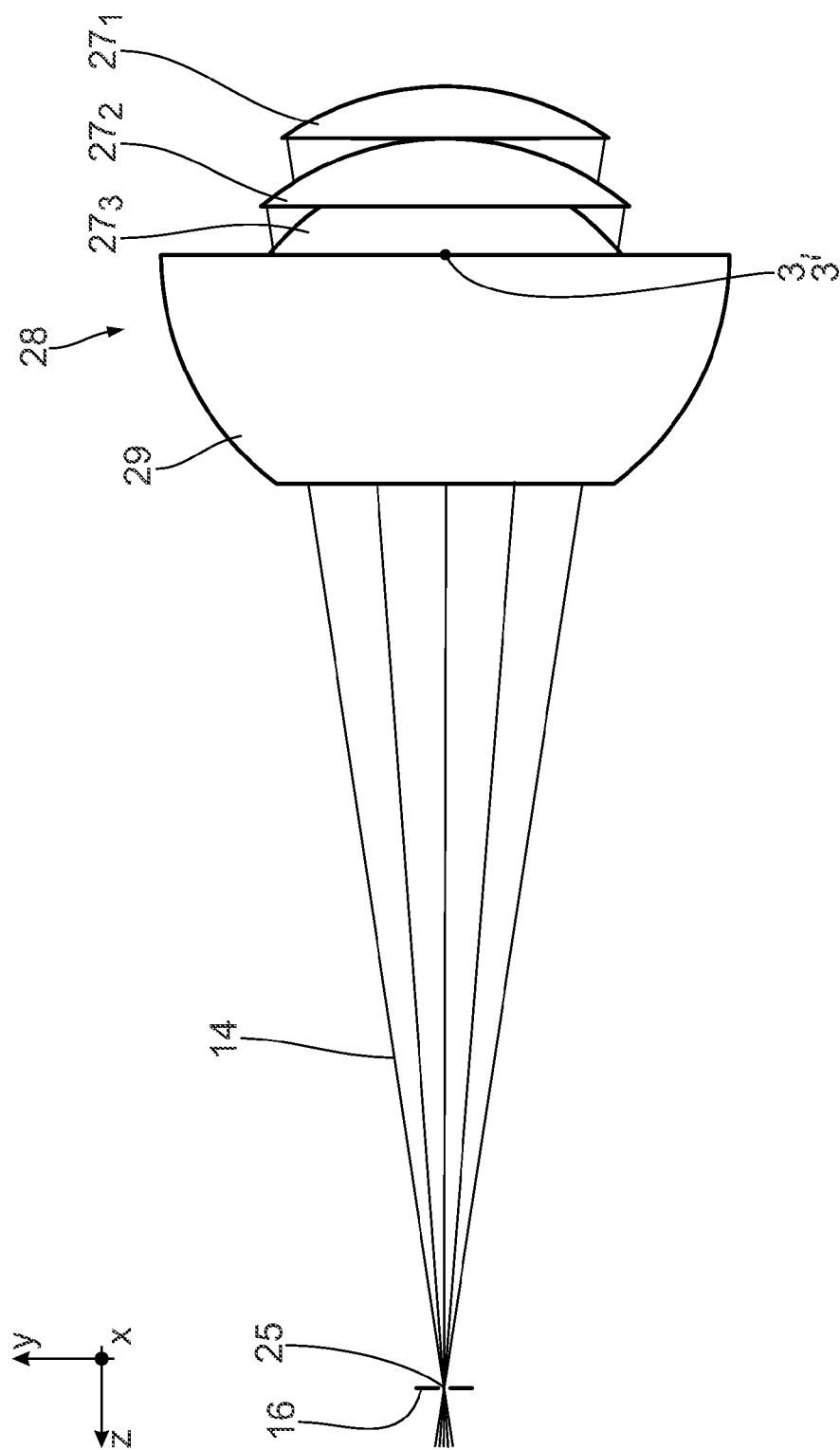
FIG. 3 perspectively shows a further embodiment of the collector, likewise with a plurality of collector imaging mirrors arranged separately from one another, of which some are embodied as ring mirrors, and additionally with spherical optics, likewise embodied as a ring mirror.

FIG. 3 shows a further embodiment of a collector 28, which can be used instead of the collector 15 according to FIGS. 1 and 2. Components and functions corresponding to those which were already explained above with reference to FIGS. 1 and 2 have the same reference signs and are not once discussed in detail again.

The collector 28 has three inner collector imaging mirrors $27_1$, $27_2$ and $27_3$, which have a design corresponding to what was already explained above in conjunction with FIG. 2. A beam angle range $\alpha$ up to a maximum beam angle $\alpha_{3,max}$ of 90° is acquired by the three collector imaging mirrors $27_1$ to $27_3$, i.e. this is the same beam angle range as was acquired by the ring mirrors $27_1$ to $27_3$ of the collector 15 according to FIG. 2.

Instead of further ring mirrors $27_n$, the collector 28 has spherical optics 29, which image the radiation source region 3 substantially onto itself in a radiation source image region 3' which lies in the region of the radiation source region 3, i.e. it either coincides with the latter or it is closely adjacent to the latter. In the case of the collector 28, these spherical optics 29 are likewise embodied as a ring mirror and cover a range of beam angles $\alpha$, by which the illumination light is emitted by the radiation source region 3, between 90° and approximately 140°. At the spherical optics 29, the illumination light 14 is substantially reflected back onto itself and it is subsequently imaged from the radiation source image region 3' by the collector imaging mirrors $27_1$ to $27_3$ into the intermediate focal region 25, as was already explained above in conjunction with FIG. 2.

FIG. 4 shows, in an exemplary manner, an xy-cross section of a component of a beam of the illumination light 14 in the intermediate focal plane 16, i.e. a cross section through the respective component of the intermediate focal region 25.

Figure 4A:
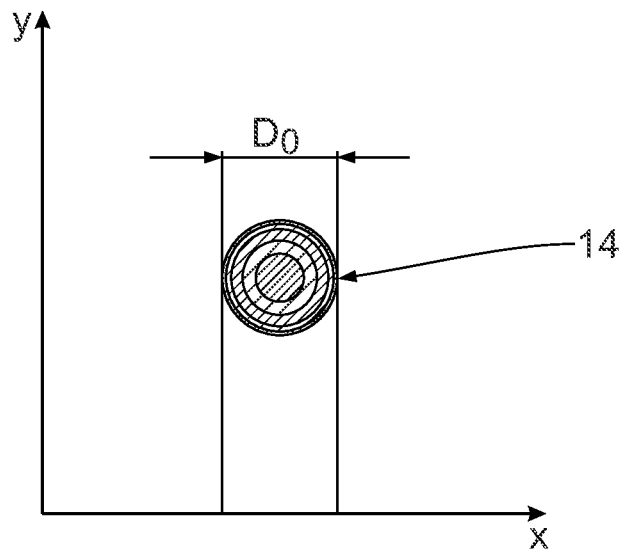
FIGS. 4a and 4b show images of a radiation source region, generated with the collector according to FIG. 3, firstly with components of illumination light with small beam angles relative to an optical axis and, secondly with illumination light components with large beam angles relative to the optical axis, in each case represented in an intensity diagram, plotted over mutually perpendicular spatial coordinates.

In this case, FIG. 4a shows the component of the beam of the illumination light 14 which is reflected by the collector imaging mirror $27_1$ with small beam angles, for example with beam angles $\alpha \leq 10°$. A diameter of the associated component of the illumination light 14 in the intermediate focal region 25 is 4.0 in arbitrary units. This diameter is also referred to as $D_0$.

Figure 4B:
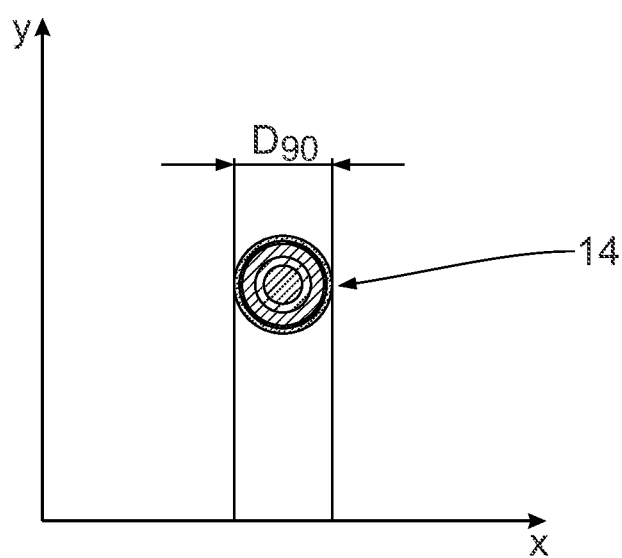

FIG. 4b shows the corresponding diameter for the component of the beam of the illumination light 14, which, with beam angles $\alpha$ in the region of 90°, is imaged into the intermediate focal region 25 by the collector imaging mirror $27_3$. In the same arbitrary units, the diameter for this illumination light component is 3.2. This diameter is also referred to as $D_{90}$.

A diameter ratio $D_0/D_{90}$ between these components of the illumination light 14 is 4.0/3.2=1.25. Accordingly, $A_0/A_{90}=1.56$ applies to the area ratio of the intermediate focal regions, firstly for the small beam angles according to FIG. 4a and secondly for the large beam angles according to FIG. 4b.

Figure 5:
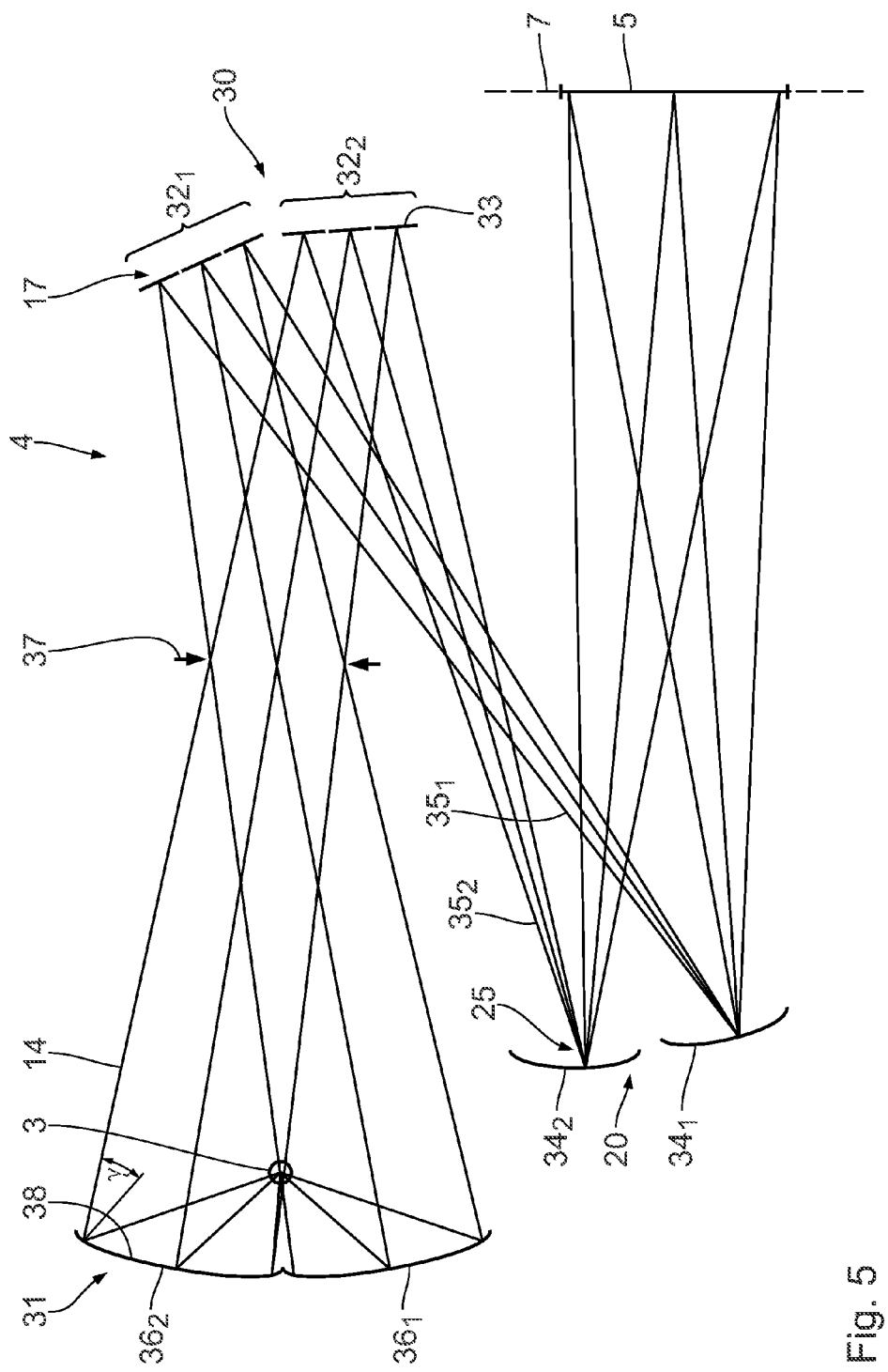
FIG. 5 very schematically shows a portion of a further embodiment of an illumination system, likewise in a meridional section, with an embodiment of a collector, a field facet mirror, of which two field facets are depicted in FIG. 5, and a pupil facet mirror, of which two pupil facets are depicted in FIG. 5, wherein a first imaging of the radiation source region of the collector imaging optics occurs in the light path after the radiation source region in a focal region disposed downstream thereof, which lies in the region of the pupil facet mirror.

FIG. 5 shows a further embodiment of an illumination system 30, which can be used in the projection exposure apparatus 1 according to FIG. 1 instead of the illumination system 2. Components and functions corresponding to those which were already explained above with reference to FIGS. 1 to 4 have the same reference signs and are not discussed in detail again.

The illumination system 30 has a collector 31.

The schematic illustration according to FIG. 5 shows two field facets $32_1$, $32_2$ of the field facet mirror 17, which field facets in turn are built up from a plurality of individual mirrors 33, of which three individual mirrors 33 are respectively shown for each field facet 32 in FIG. 5. In practice, the number of individual mirrors 33 per field facet 32 can be substantially higher.

In practice, the number of field facets 32 is substantially higher. By way of example, several hundred field facets 32 can be present in the field facet mirror 17.

FIG. 5 furthermore schematically depicts two pupil facets $34_1$ and $34_2$ of the pupil facet mirror 20, which pupil facets are associated with the field facets $32_1$ and $32_2$ by way of the illumination channels $35_1$ and $35_2$.

A downstream focal region 25, which functionally corresponds to the focal region 25 according to FIG. 1, constitutes the first image of the radiation source region 3 by collector imaging mirrors $36_1$, $36_2$ of the collector 31 in the beam path of the illumination light 14 downstream of the radiation source region 3. In the illumination system 30, this downstream focal region 25 lies in the region of the pupil facet mirror 20.

The pupil facets 34 are part of pupil facet transfer optics, which image the field facets 32 in a manner superposed on one another into the object field 5, as is depicted schematically in FIG. 5.

A constriction region 37 is situated between the collector 31 and a first component of the illumination optics 4 of the illumination system 30, i.e. the field facet mirror 17. In the constriction region 37, a cross section of a whole beam of the EUV illumination light 14 is reduced by at least a factor of 2 as compared to the cross section on the field facet mirror 17; this has not been reproduced to scale in the schematic illustration of FIG. 5, which only depicts two field facets 32.

The constriction region 37 does not constitute a focal region of the collector imaging optics of the collector 31. The focal region 25 is arranged downstream in the beam path of the illumination light 14, namely in the region of the pupil facet mirror 20. The field facet mirror 17 is arranged in the beam path of the illumination light 14 between the constriction region 37 and the focal region 25.

The collector imaging mirrors $36_n$ of the collector 31 are embodied as free-form surfaces. Mirror surfaces 38 of the collector imaging mirrors $36_n$ are embodied in such a way that a maximum angle of incidence $\gamma_{max}$ of the illumination light 14 on the collector imaging mirrors $36_n$, is less than 45°. An edge contour of the collector imaging mirrors $36_n$ has a similar embodiment to an edge contour of the field facets $32_n$.

The collector imaging mirrors $36_n$ have a rectangular edge contour. Alternatively, a bent and, for example, partial ring-shaped edge contour of the collector imaging mirrors $36_n$, is also possible, in particular if arcuate field facets $32_n$ are used.

Figure 6:
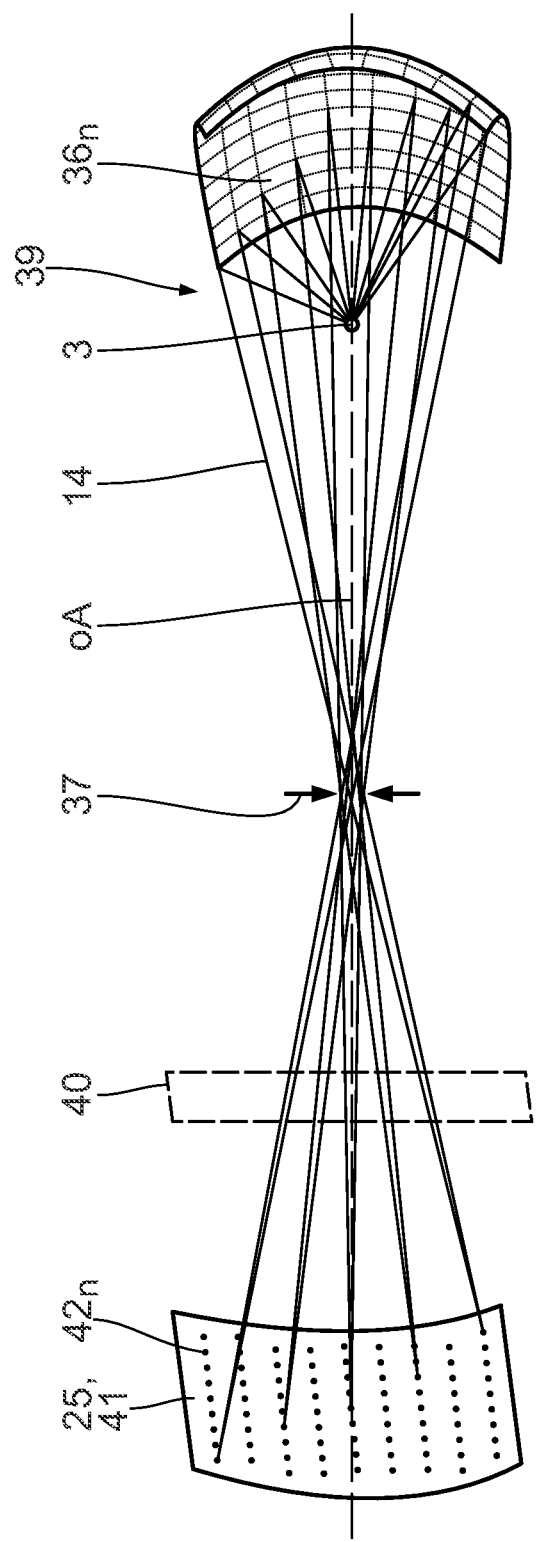
FIG. 6 perspectively shows an embodiment of the illumination system according to FIG. 5, wherein reflective effects of the field facets and the pupil facets have been omitted and the beam path of the EUV illumination light is depicted as far as the downstream focal region of a plurality of collector imaging mirrors, arranged separately from one another, of the collector according to FIG. 5.

FIG. 6 shows a schematic illustration of a further embodiment of a collector 39 which, in particular, can be used instead of the collector 31. Components and functions which were already explained above in the context of FIGS. 1 to 5, in particular in the context of FIG. 5, have the same reference signs and are not discussed in detail again.

The collector 39 has a total of 81 collector imaging mirrors $36_n$, which are arranged tightly packed in a tessellated form and in lines and rows, in a grid-like manner, in the style of a 9×9 matrix. FIG. 6 depicts an arrangement plane 40 for a field facet mirror in the style of the field facet mirror 17 in the beam path downstream of the constriction region 37. The field facet mirror itself and also the reflecting effect thereof on the illumination light 14 are not depicted in FIG. 6. FIG. 6 shows the imaging effect of the collector imaging mirrors $36_n$, in the further course of the beam path, depicted in an exemplary manner for some collector imaging mirrors $36_n$, of the illumination light 14 after the arrangement plane 40 such that a 9×9 grid of radiation source images $42_n$ is created in a further arrangement plane 41, depicted in a perspective manner in FIG. 6, in which a pupil facet mirror in the style of the pupil facet mirror 20 is arranged, which radiation source images are generated by the collector imaging mirrors $36_n$ as first images of the radiation source region 3 in the beam path or along the light path of the illumination light 14 downstream of the radiation source region 3. A pupil facet of the pupil facet mirror 20 is arranged at the location of each radiation source image $42_n$. The arrangement plane 41 of the radiation source images $42_n$ constitutes the intermediate focal region 25 of the collector 39. FIG. 6 shows clearly that this first intermediate focal region 41 disposed downstream of the radiation source region 3 is spatially separated from the constriction region 37.

FIG. 7 shows far-field variants of the illumination light 14, which are created, firstly, by the collector 39 and, secondly, by a correspondingly designed, alternative collector with collector imaging mirrors arranged in the style of a 19×19 matrix. Different intensity values I are hatched in accordance with the scale indicated on the right in each case.

Figure 7A:
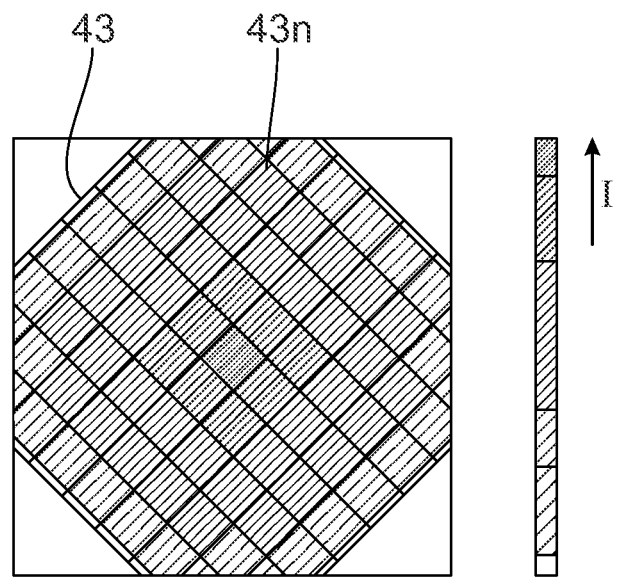
FIGS. 7a and 7b show far-field intensity distributions for embodiments of the collector according to FIGS. 5 and 6, firstly with a grid of 9×9 collector imaging mirrors and, secondly with a grid of 19×19 imaging mirrors, in each case in an intensity representation similar to FIG. 5.
Figure 7B:
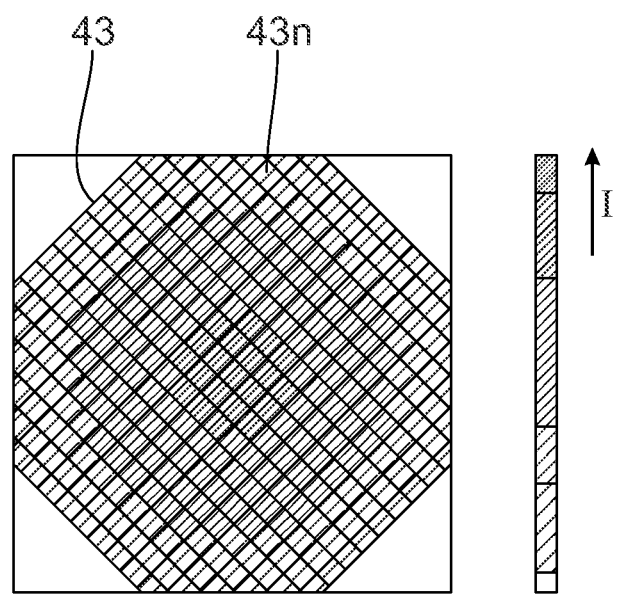

The far fields according to FIGS. 7a, 7b are present where the partial beams of the illumination light 14 guided over the individual collector imaging mirrors $36_n$ have just completely run apart again downstream constriction region 37. In this far field, no far field point sees light from more than one collector imaging mirror $36_n$. Thus, an arrangement of a field facet mirror in the arrangement plane 40 leads to no field facet being impinged upon by illumination light 14 which is reflected by more than one collector imaging mirror $36_n$.

As a result of the tilt of the alignment of the collector imaging mirrors $36_n$ for generating the constriction region 37, a tile-like offset portion-by-portion composition of the overall far field 43 emerges in the far field. In the 9×9 far field 43 according to FIG. 7a, intensity steps at the adjacent far field portions $43_n$ associated with the individual collector imaging mirrors $36_n$ are greater than in the case of the 19×19 far field according to FIG. 7b.

As the number of collector imaging mirrors $36_n$, which are arranged in a matrix-like manner in the style of the collector 39, increases at a given collector size, it is possible to have an ever smaller emerging cross section of the constriction region 37 relative to the size of the collector. By way of example, a cross section of the constriction region 37 with absolute dimensions of 20 mm×20 mm, or else 40 mm×40 mm, can be obtained.

FIG. 8 shows a further embodiment of an illumination system 44, which can be used in turn in the projection exposure apparatus 1 instead of the illumination system 2. Components and functions corresponding to those which were already explained above with reference to FIGS. 1 to 7 have the same reference signs and are not discussed in detail again.

A collector 45 of the illumination system 44 has collector imaging mirrors $46_n$, of which a total of five collector imaging mirrors, namely an innermost collector imaging mirror $46_1$, two central collector imaging mirrors $46_2$, $46_{2'}$, adjacent thereto, and outer collector imaging mirrors $46_3$, $46_{3'}$, adjacent thereto in turn, are depicted in FIG. 8.

The innermost collector imaging mirror $46_1$ images components of the illumination light 14 which are emitted with beam angles relative to the optical axis oA from the radiation source region 3, which are less than 20°. The beam angles which, in turn, are imaged by the outermost collector imaging mirrors $46_3$, $46_{3'}$ are greater than 70°. The interposed central collector imaging mirrors $46_2$, $46_{2'}$ image interposed beam angles of the illumination light 14.

An imaging effect of the innermost collector imaging mirror $46_1$ is such that an intermediate focus $47_1$, which is generated by the collector imaging mirror $46_1$ as an image of the radiation source region 3, is arranged at a distance $F_1$ from the radiation source region 3. The intermediate focus $47_1$ lies on the optical axis oA.

Intermediate foci $47_2$, $47_{2'}$, which are generated by the central collector imaging mirrors $46_2$, $46_{2'}$, have a distance $F_2$ from the radiation source region 3, for which $F_2 > F_1$ applies. The intermediate foci $47_2$, $47_{2'}$, are at a distance from the optical axis oA.

Intermediate foci $47_3$, $47_{3'}$, which are generated by the outer collector imaging mirrors $46_3$, $46_{3'}$, have a distance $F_3$ from the radiation source region 3, for which the following applies: $F_3 > F_2$. The intermediate foci $47_3$, $47_{3'}$ are, in turn, at a distance from the optical axis oA.

The intermediate foci $47_1$, $47_2$, $47_{2'}$, $47_3$, $47_{3'}$ are spatially separated from one another in each case.

A constriction region 37 of the whole beam of the illumination light 14 lies between the collector 45 and the field facet mirror 17, which, once again, is depicted schematically in FIG. 8 without a reflecting effect.

The constriction region 37 is spatially separated at least from some of the intermediate foci 47, namely from the intermediate foci $47_1$, $47_2$ and $47_{2'}$. Therefore, the constriction region 37 does not coincide with the focal region 25 in this embodiment either.

As a result of the different focal distances $F_1$, $F_2$, $F_3$, different imaging scales $\beta_K$ of the collector imaging mirrors 46, which emerge due to the different beam angles of the illumination light 14 imaged thereby, are compensated in such a way that a size variation of the intermediate foci 47 is reduced.

The intermediate foci 47 are imaged on the pupil facets of the pupil facet mirror 20 with different facet imaging scales $\beta_F$ by the field facets $48_n$ associated therewith in such a way that images of the intermediate foci 47 on the pupil facets have substantially the same size and differ in terms of cross section by, for example, less than 30%, less than 20%, less than 15%, less than 10%, or even by less than 5%.

A first focal region, namely the intermediate focus $47_1$, is e.g. imaged with a first facet imaging scale $\beta_{F1}$. A second focal region, for example, the intermediate foci $47_2$, $47_{2'}$, are imaged with a second facet imaging scale $\beta_{F2}$. The overall focal region 25 is formed by the various spatially separated intermediate foci $47_n$ in the embodiment according to FIG. 8.

Figure 9:
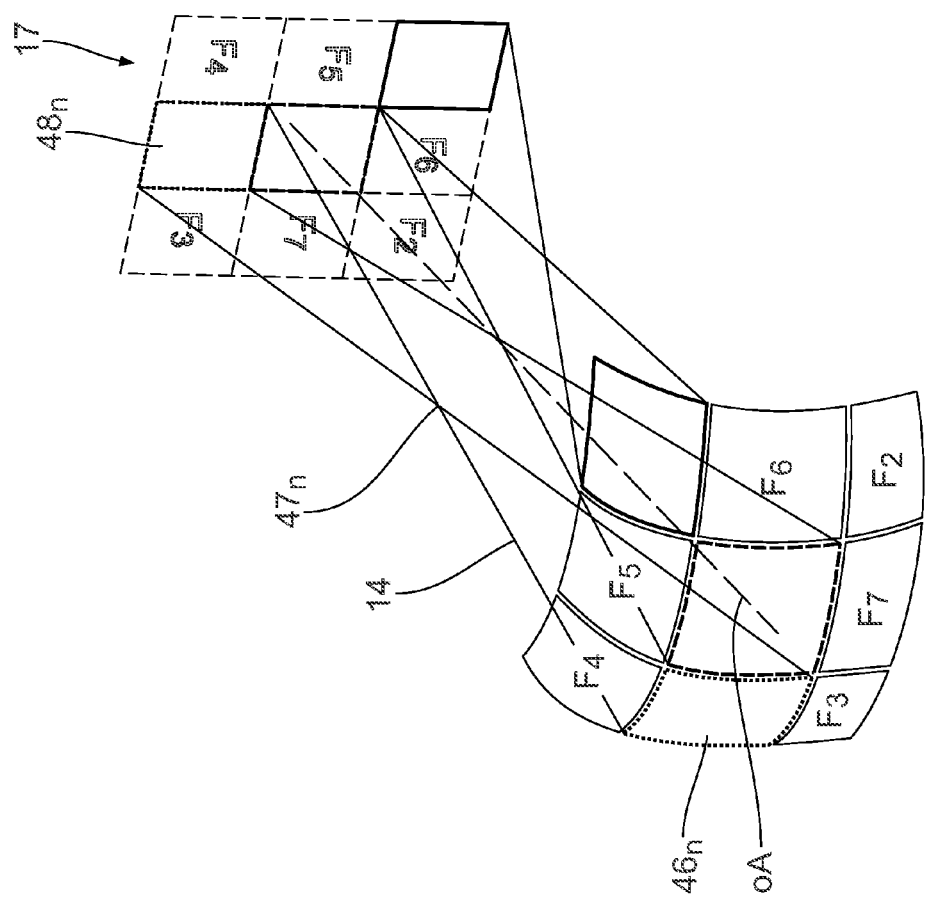
FIG. 9 perspectively shows exemplary beam paths of the illumination light in the illumination system according to FIG. 8 between collector imaging mirrors of the collector and field facets of the field facet mirror.

FIG. 9 shows an association between the collector imaging mirrors $46_n$ and the field facets $48_n$. The index n of the association $F_n$ is respectively depicted as a large number for the collector imaging mirrors 46 and the field facets 48 in FIG. 9. As a result of the inverting effect by the intermediate foci $47_n$, these indices are imaged upside down on the field facet mirror 17.

Figure 10:
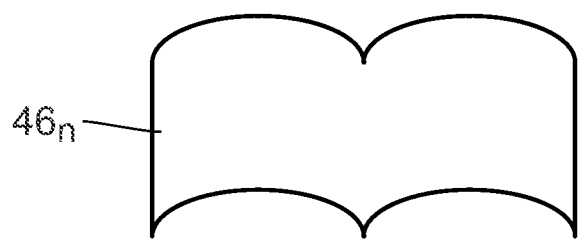
FIG. 10 schematically shows an embodiment of an edge contour of a mirror surface of a collector mirror of a plurality of collector mirrors arranged separately from one another, wherein this edge contour is similar to an edge contour of a field facet group made of two field facets lying next to one another in one embodiment of the field facet mirror with arcuate field facets.

In respect of the edge contour thereof, the collector imaging mirrors $46_n$ can have a square, rectangular, hexagonal or else, as depicted in FIG. 10, an arcuate embodiment. In this case, the collector imaging mirrors $46_n$ can be formed as individual arcs, which is not depicted in any more detail, or else as double arcs, as depicted in FIG. 10, for impinging two adjacent arcuate field facets $48_n$. More than one field facet $48_n$, for example a group of field facets $48_n$, can be impinged by the illumination light 14 by way of a collector imaging mirror $46_n$. To the extent that the field facets $48_n$ are arranged line-by-line and column-by-column, the group of field facets $48_n$ impinged simultaneously by illumination light 14 by way of a collector imaging mirror $46_n$ can lie in a plurality of columns and/or in a plurality of lines of this field facet arrangement. By way of example, two columns of arcuate field facets $48_n$ lying next to one another can be illuminated with an edge contour of a collector imaging mirror $46_n$ according to FIG. 10.

The number of collector imaging mirrors $46_n$ can lie in the range between five and 25.

Figure 11:
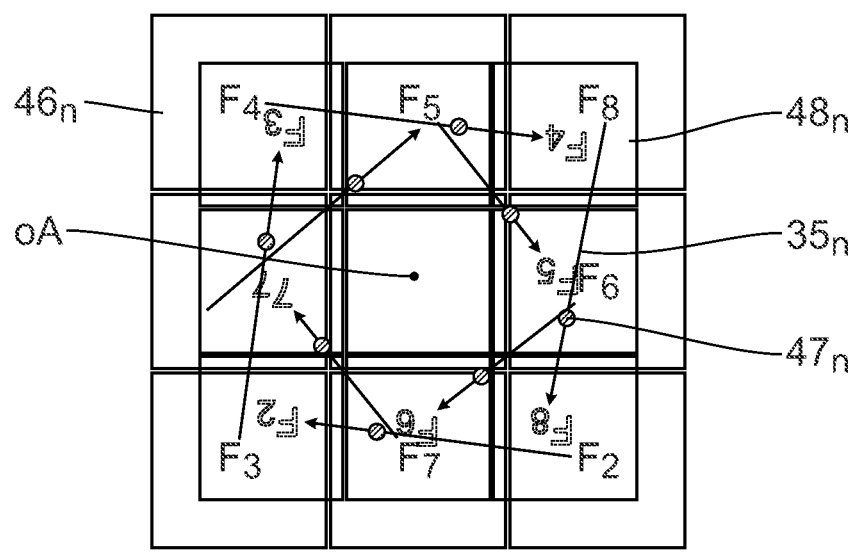
FIG. 11 shows the light paths of the illumination light between individual collector imaging mirrors of the collector according to FIG. 9 and the field facets of the field facet mirror according to FIG. 9 in an exemplary manner, as seen in the direction of the optical axis between the collector and the field facet mirror, wherein the arrangement of first focal regions, disposed downstream of the radiation source region and generated by the collector imaging mirrors, is also depicted in each case.

FIG. 11 shows a possible association $F_n$ between collector imaging mirrors $46_n$ and field facets $48_n$ in the case of a 3×3 matrix arrangement of both the collector imaging mirrors $46_n$ and the field facets $48_n$. The view according to FIG. 11 is implemented with the direction of view along the optical axis oA. The collector imaging mirrors $46_n$ are indicated as larger squares and the field facets $48_n$ are indicated as smaller squares. Like in FIG. 9, the indices of the collector imaging mirrors $46_n$ are reproduced as large numbers and the indices of the field facets $48_n$ are reproduced as smaller and upside down numbers in FIG. 11 as well. The same indices indicate an association of the respective collector imaging mirror $46_n$ with the respective field facet $48_n$ by way of a corresponding illumination light illumination channel $35_n$. The location of the respective intermediate focus $47_n$ is also depicted in the illumination channels between the respective collector imaging mirror $46_n$ and the associated field facet $48_n$.

A product of the collector imaging scale $\beta_K$ of the collector imaging mirror $46_1$ and the facet imaging scale $\beta_F$ of the associated field facet differs from a product of the collector imaging scales $\beta_K$ of the further collector imaging mirrors $46_n$ and the associated facet imaging scales $\beta_F$ of the field facets for all light paths of the illumination light 14 to the pupil facets of the pupil facet mirror 20 by no more than a factor of 2.5. This difference of the scale products of the collector imaging scale and the associated facet imaging scale can be at most 2.25, at most 2.0, at most 1.9, at most 1.8, at most 1.7, at most 1.6 or else at most 1.5, depending on the embodiment of the illumination system 45.

The field facets of the field facet mirror 17 according to FIG. 8 are part of field facet transfer optics, which image respectively one of the focal regions $47_n$ onto one of the pupil facets of the pupil facet mirror 20.

For the purposes of producing a nanostructured or microstructured component, for example a semiconductor memory chip, provision is initially made of the reticle 7 and the wafer 12 with a coating sensitive to the light of the illumination light 14. Then, at least a portion of the reticle 7 is projected onto the wafer 12 with the aid of the projection exposure apparatus 1. Subsequently, the light-sensitive layer on the wafer 12, exposed to the illumination light 14, is developed. Carried-along foreign particles, which are emitted by components of the radiation source, can be suppressed in the constriction region.

What is claimed is:

1. A collector configured to transfer EUV illumination light from a radiation source region toward illumination optics configured to guide the EUV illumination light toward an object field, wherein:
   the collector configured for reflecting guidance of the EUV illumination light with angles of incidence less than 45°;
   the collector comprises collector imaging optics configured to image the radiation source region into a focal region disposed downstream collector imaging optics;
   the collector imaging optics are configured so that during use of the collector:
      the radiation source is imaged into the focal region with a first imaging scale via EUV illumination light emitted by a radiation source region with beam angles less than 20° with respect to an optical axis between the radiation source region and the focal region; and
      the radiation source is imaged into the focal region with a second imaging scale via EUV illumination light emitted by the radiation source region with beam angles greater than 70° with respect to the optical axis between the radiation source region and the focal region; and
   the first and second imaging scales differ by no more than a factor of 2.5.

2. The collector of claim 1, wherein:
   the collector imaging optics comprises a plurality of collector imaging mirrors arranged separately from one another;
   each collector imaging mirror is configured to acquire EUV illumination light from the radiation source region which is emitted in an angular range of beam angles in relation to an optical axis between the radiation source region and the focal region;
   a range of imaging scales of each collector imaging mirror lies between a minimum imaging scale and maximum imaging scale; a ratio of the maximum imaging scale to the minimum imaging scale is ≤2.

3. The collector of claim 2, wherein at least some of the collector imaging mirrors are configured as ring mirrors.

4. The collector of claim 3, wherein mirror surfaces of at least some of the collector imaging mirrors are ellipsoidal.

5. The collector of claim 3, comprising spherical optics configured to image the radiation source region in a radiation source image region which lies in the region of the radiation source region.

6. The collector of claim 2, wherein mirror surfaces of at least some of the collector imaging mirrors are ellipsoidal.

7. The collector of claim 2, comprising spherical optics configured to image the radiation source region in a radiation source image region which lies in the region of the radiation source region.

8. An illumination system, comprising:
   a collector according to claim 1; and
   illumination optics, comprising a field facet mirror and a pupil facet mirror.

9. The illumination system of claim 8, wherein:
   the illumination system is configured so that during use of the illumination system first imaging of the radiation source region of the collector imaging optics in the beam path of the illumination light after the radiation source region occurs in the downstream focal region; and
   the downstream focal region lies in a region of the pupil facet mirror.

10. The illumination system of claim 9, wherein:
    a constriction region lies between the collector and a first component of the illumination optics; and in the constriction region, a cross section of the overall beam of the EUV illumination light is reduced by at least a factor of two compared to the cross section on the field facet mirror.

11. The illumination system of claim 9, wherein the collector imaging optics comprises a plurality of collector mirrors arranged separately from one another.

12. The illumination system of claim 11, wherein at least some of the mirror surfaces of the collector mirrors have an edge contour which is similar to an edge contour of field facets of the field facet mirror.

13. The illumination system of claim 11, wherein the collector mirrors have a rectangular edge contour.

14. An apparatus, comprising:
an illumination system comprising a collector according to claim 1; and
a projection optical unit,
wherein the apparatus is a projection exposure apparatus.

15. An apparatus, comprising:
an illumination system comprising s collector according to claim 1; and
an EUV radiation source.

16. A method of operating a projection exposure apparatus comprising an illumination system and a projection optical unit, the method comprising:
using the illumination system to illuminate part of a reticle; and
using the projection optical unit to image part of the illuminated reticle onto a light-sensitive material,
wherein the illumination system comprises a collector according to claim 1.

* * * * *

UNITED STATES PATENT AND TRADEMARK OFFICE
CERTIFICATE OF CORRECTION

PATENT NO. : 9,810,890 B2  
APPLICATION NO. : 15/061597  
DATED : November 7, 2017  
INVENTOR(S) : Markus Deguenther Page 1 of 1

It is certified that error appears in the above-identified patent and that said Letters Patent is hereby corrected as shown below:

In the Specification

Column 10, Line 46, delete "$36_n$," and insert -- $36_n$ --.

Column 10, Line 50, delete "$36_n$," and insert -- $36_n$ --.

Column 10, Line 57, delete "$36_n$," and insert -- $36_n$ --.

Column 11, Line 7, delete "$36_n$," and insert -- $36_n$ --.

In the Claims

Column 15, Line 20, Claim 15, delete "s" and insert -- a --.

Signed and Sealed this  
Second Day of January, 2018

Joseph Matal  
*Performing the Functions and Duties of the*  
*Under Secretary of Commerce for Intellectual Property and*  
*Director of the United States Patent and Trademark Office*